United States Patent [19]

Yamaguchi

[11] Patent Number: 5,297,088
[45] Date of Patent: Mar. 22, 1994

[54] RANDOM ACCESS MEMORY DEVICE WITH REDUNDANT ROW DECODER FOR CONTROLLING A PLURALITY OF REDUNDANT WORD LINES

[75] Inventor: Takashi Yamaguchi, Tokyo, Japan

[73] Assignee: Nec Corporation, Tokyo, Japan

[21] Appl. No.: 810,037

[22] Filed: Dec. 19, 1991

[30] Foreign Application Priority Data

Dec. 25, 1990 [JP] Japan ................. 2-413753

[51] Int. Cl.$^5$ ............................... G11C 7/00
[52] U.S. Cl. .................. 365/200; 365/230.06; 371/10.3
[58] Field of Search .............. 365/200, 230.06; 371/10.1, 10.2, 10.3; 307/441, 219

[56] References Cited

U.S. PATENT DOCUMENTS 4,691,301 9/1987 Anderson ..................... 371/10.3
4,935,899 6/1990 Morigami ..................... 365/200

Primary Examiner—Eugene R. LaRoche
Assistant Examiner—Christopher R. Glembocki
Attorney, Agent, or Firm—Sughrue, Mion, Zinn, Macpeak & Seas

[57] ABSTRACT

A row of defective memory cells is replaceable with a row of redundant memory cells for rescuing a random access memory device, and a programming circuit discriminates the address assigned to the row of defective memory cells for allowing a redundant row address decoder circuit to drive a redundant word line coupled with the row of redundant memory cells, wherein the programming circuit checks predetermined row address bits selected from all the row address bits to see whether or not the rows of defective memory cells are accessed for producing an output signal, and the redundant row address decoder circuit identifies one of the redundant word lines on the basis of the other row address bit so that the programming circuit is shared between the redundant word lines, thereby decreasing the real estate for the programming circuit.

8 Claims, 4 Drawing Sheets

RANDOM ACCESS MEMORY DEVICE WITH REDUNDANT ROW DECODER FOR CONTROLLING A PLURALITY OF REDUNDANT WORD LINES

FIELD OF THE INVENTION

This invention relates to a random access memory device and, more particularly, to a redundant row address decoder for selectively driving redundant word lines.

DESCRIPTION OF THE RELATED ART

Referring to FIG. 1 of the drawings, a random access memory device is fabricated on a single semiconductor chip 1, and the random access memory device comprises a regular memory cell array 2a implemented by a large number of regular memory cells M11, M1n, M21 and M2n, Mm1 . . . and Mmn, and arranged in rows and columns. The prior art random access memory device further comprises a redundant memory cell array 2b constituted by a plurality of redundant memory cells RM11, RM1n, RMk1 and RMkn, and are arranged in rows and columns. The regular memory cells M11 to Mmn and the redundant memory cells RM11 to RMkn are similar in circuit arrangement, and each row of the regular memory cells M11 to Mmn is replaceable with one of the rows of the redundant memory cells RM11 to RM1n or RMk1 to RMkn.

The rows of the regular memory cell array 2a are respectively associated with a plurality of regular word lines WL1 WL2 to WLm, and the rows of the redundant memory cell array 2b are respectively associated with redundant word lines RW1 to RWk. A plurality of digit line pairs DL1 to DLn are shared between the regular memory cell array 2a and the redundant memory cell array 2b, and each of the digit line pairs DL1 to DLn is coupled with one of the columns of the regular memory cell array 2a and one of the columns of the redundant memory cell array 2b.

A precharging unit 3 is provided for the digit line pairs DL1 to DLn, and the precharging unit 3 comprises p-channel enhancement type charging transistors QP1 coupled between a power voltage line Vdd and the bit line pairs DL1 to DLn and p-channel enhancement type balancing transistors QP2 coupled between the drain nodes of the associated p-channel enhancement type charging transistors QP1. The p-channel enhancement type charging transistors QP1 and the p-channel enhancement type balancing transistors QP2 are responsive to a precharging signal PCH of active low voltage level. When the precharging signal PCH allows the p-channel enhancement type charging transistors QP1 and the p-channel enhancement type balancing transistors QP2 to simultaneously turn on, the power voltage line Vdd is coupled with the bit line pairs DL1 to DLn through the p-channel enhancement type charging transistors QP1, and the digit lines of every digit line pair is equalized through the associated p-channel enhancement type balancing transistor QP2.

The digit line pairs DL1 to DLn are further coupled with a column selector 4, and the column selector 4 is implemented by pairs of n-channel enhancement type transfer transistors QN3. Each pair of n-channel enhancement type transfer transistors QN3 is associated with one of the digit line pairs DL1 to DLn, and all pairs of n-channel enhancement type transfer transistors QN3 are coupled between the digit line pairs DL1 to DLn and a data bus 5. Though not shown in FIG. 1, the data bus 5 is further coupled with a data buffer unit, and the data buffer unit is communicable with an external device.

A row address decoder unit 6 is associated with the regular word lines WL1 to WLm, and the row address decoder unit 6 has a plurality of row address decoder circuits each provided in association with every two regular word lines. FIG. 1 shows only one of the plurality of row address decoder circuits which is designated by reference 6a. The row address decoder circuit 6a is implemented by a NAND gate 6aa and two NOR gates 6ab and 6ac, and the NOR gates 6ab and 6ac drive the associated regular word line WL1 and WL2. Though not shown in FIG. 1, an external row address signal is supplied to a predecoder unit, and the predecoded row address signals are selectively distributed to the plurality of row address decoder circuits. The row address bit A0 and the complementary bit thereof CA0 are respectively supplied from an address buffer unit (not shown) to the NOR gates 6ab and 6ac, and the predecoded row address signals are selectively supplied to the NAND gates 6aa. Therefore, the row address decoder unit 6 drives one of the regular word lines WL1 to WLm, and the regular word line driven by the row address decoder unit 6 allows the associated row of the regular memory cells to be coupled with the digit line pairs DL1 to DLn.

A column address decoder unit 7 is provided for the column selector unit 4, and is implemented by a plurality of NOR gates. One of the NOR gates is shown in FIG. 1, and is labeled with 7a. Each of the NOR gates forming a part of the column address decoder unit 7 is coupled with one of the pairs of n-channel enhancement type transfer transistors QN3, and the column address decoder unit 7 allows the pairs of n-channel enhancement type transfer transistors QN3 to selectively turn on. Namely, when an external column address signal is supplied to a predecoder unit (not shown), the predecoder unit produces predecoded column address signals, and selectively distributes the predecoded column address signals to the NOR gates. The predecoded column address signals allow one of the NOR gates of the column selector unit 4 to produce a gate control signal of an active high voltage level, and the associated pair of n-channel enhancement type transfer transistors QN3 to turn on.

If all of the regular memory cells M11 to Mmn are excellent, any row of the regular memory cell array 2a is not replaced with the row of the redundant memory cells RM11 to RM1n or RMk1 to RMkn. Therefore, only the regular memory cell array 2a serves as a data storage, and data bits are written into or read out from the regular memory cell array 2a. Namely, if the external row address signal and the external column address signal are indicative of the address assigned to the regular memory cell M11, the row address decoder unit 6 drives the regular word line WL1 to the active high voltage level, and the column address decoder unit 7 allows the pair of n-channel enhancement type transfer transistors QN3 associated with the bit line pair DL1 to turn on. In this situation, the data bus 5 is coupled with the regular memory cell M11, and a data bit is read out from or written into the regular memory cell M11 through the data bus 5

However, if a defective regular memory cell is found in a diagnosis operation, the row containing the defective regular memory cell is replaced with one of the rows of the redundant memory cell array 2b, and the row of the redundant memory cells forms a part of the data storage instead of the row containing the defective memory cell.

In detail, a redundant row address decoder unit 8 is provided for the redundant word lines RW1 to RWk, and the redundant row address decoder unit 8 is implemented by a plurality of redundant row address decoder circuits 81 to 8k coupled with the redundant word lines RW1 to RWk, respectively. The redundant row address decoder circuits 81 to 8k are respectively associated with programming circuits 91 to 9k, and each of the programming circuits 91 to 9k stores the row address assigned to a row of the regular memory cells replaced with the associated row of the redundant memory cells. The row of the regular memory cells replaced with the row of the redundant memory cells is hereinbelow referred to as "defective row". The row address bits A0 to Ai and the complementary bits CA0 to CAi thereof are supplied in parallel from the address buffer unit (not shown) to the programming circuits 91 to 9k, and the programming circuits 91 to 9k monitor the row address bits A0 to Ai and the complementary bits CA0 to CAi to see whether or not the external row address signal is indicative of the address assigned to one of the defective rows. If a regular memory cell in one of the defective rows is accessed, one of the programming circuits 91 to 9k discriminates the row address assigned to the defective memory cell, and causes the associated redundant row address decoder circuit to lift the associated redundant word line to the active high voltage level. The row address decoder unit 6 allows the regular word line coupled with the defective memory cell to remain inactive. For this reason, the redundant memory cells are respectively coupled with the digit line pairs DL1 to DLn instead of the row containing the defective memory cell.

Each of the redundant row address decoder circuits 81 to 8k is illustrated in detail in FIG. 2, and comprises a NAND gate 8aa and an inverting circuit 8ab coupled in series. The inverting circuit 8ab is coupled with the associated redundant word line, and drives it to the active high voltage level when the associated programming circuit allows the associated NAND gate 8aa to shift the output node thereof to the low voltage level. Each of the programming circuits 91 to 9k is implemented by a plurality of discriminators 910 to 91i, and the discriminators 910 to 91i are respectively assigned the row address bits A0 to Ai.

As shown in FIG. 3, each of the discriminators 910 to 91i has a memory section 9aa and a switching section 9ab, and the switching section 9ab transfers one of the row address bit and the complementary bit to the associated NAND gate 8aa depending upon a bit of redundant information stored in the memory section 9aa. The memory section 9aa is implemented by a series combination of a fuse element FS1 and an n-channel enhancement type field effect transistor QN4 coupled between the power voltage line Vdd and the ground voltage line. On the other hand, the switching section 9ab has a series combination of inverting circuits IV1 and IV2, and two parallel combinations TG1 and TG2 of p-channel enhancement type field effect transistors QP4 and QN5. The drain node of the n-channel enhancement type field effect transistor QN4 is coupled with the input node of the inverting circuit IV1, and the n-channel enhancement type field effect transistor QN4 is gated by the output node of the inverting circuit IV1. The output node of the inverting circuit IV1 is coupled with the gate electrode of the p-channel enhancement type field effect transistor QP4 of the parallel combination TG1 and with the gate electrode of the n-channel enhancement type field effect transistor QN5 of the parallel combination TG2. However, the output node of the inverting circuit IV2 is coupled with the gate electrode of the n-channel enhancement type field effect transistor QP4 of the parallel combination TG1 and with the gate electrode of the p-channel enhancement type field effect transistor QN5 of the parallel combination TG2. The row address bit assigned thereto is supplied to the parallel combination TG1, and the complementary bit is supplied to the parallel combination TG2.

The discriminators 910 to 91i thus arranged behave as follows. The defective row is expressed by a string of the row address bits A0 to Ai, and the fuse elements FS1 are selectively broken if the row address bits assigned thereto are logic "1" level. If one of the fuse element FS1 has been broken, the inverting circuit IV1 allows the n-channel enhancement type field effect transistor QN4 to turn on, and the inverting circuit IV1 fixes the output node thereof to the low voltage level. This results in that the inverting circuit IV2 continuously produces the high voltage level, and the parallel combination TG2 transfers the row address bit of logic "1" level to the associated NAND gate 8aa. On the other hand, if another fuse element FS1 couples the power voltage line Vdd to the input node of the inverting circuit IV1, the inverting circuit IV1 forces the n-channel enhancement type field effect transistor QN4 to turn off, and the inverting circuit IV2 produces the output of the high voltage level. This results in that the parallel combination TG1 transfers the complementary bit of logic "1" level to the associated NAND gate 8aa. Thus, if the row address assigned to the defective row is matched with the row address represented by the row address bits A0 to Ai, the programming circuit 91 or 9k supplies logic "1" levels to the NAND gate 8aa of the associated redundant row address decoder circuit 81 or 8k, and the NAND gate 8aa yields logic "0" level at the output node thereof. With the logic "0" level, the inverting circuit 8ab drives the associated redundant word line RW1 or RWk to the active high voltage level.

However, a problem is encountered in the prior art random access memory device in a serious trade-off between the chip size and the rescue work. In detail, assuming now that the prior art random access memory device shown in FIG. 1 is of the 1 mega-bit type having 512 word lines and 2048 bit line pairs, the regular memory cell array 2a requires 9 row address bits, and each of the programming circuits 91 to 9k consists of 9 discriminators 910 to 91i. If the redundant memory cell array 2b has two redundant word lines RW1 to RWk, the total number of the discriminators 910 to 91i are 18. A redundant memory cell array 2b with 4 redundant word lines requires 36 discriminators. A large number of discriminators 910 to 91i occupy a large amount of real estate, and the semiconductor chip 1 tends to be enlarged. However, the more redundant word lines RW1 to RWk the random access memory device has, the higher rescue the redundant word lines RW1 to RWk achieve. Thus, there is a trade-off between the chip size and the rescue work.

SUMMARY OF THE INVENTION

It is therefore an important object of the present invention to provide a random access memory device including a redundant unit of which achieves higher rescue work without increasing the occupation area.

To accomplish the object, the present invention proposes to sequentially select a redundant word line.

In accordance with the present invention, there is provided a random access memory device fabricated on a single semiconductor chip, comprising: a) a plurality of regular memory cells arranged in rows and columns, and respectively storing data bits, each of the regular memory cells having a row address indicated by a plurality of row address bits and a column address indicated by a plurality of column address bits; b) a plurality of regular word lines respectively associated with the rows of the regular memory cells, and selectively driven for making one of the rows of the regular memory cells accessible; c) a plurality of redundant memory cells arranged in rows and columns, each of the rows of the regular memory cells being replaceable with one of the rows of the redundant memory cells for storing data bits; d) a plurality of redundant word lines respectively associated with the rows of the redundant memory cells, and selectively driven for making one of the rows of the redundant memory cells accessible; e) at least one programming circuit storing address bits, and operative to see whether or not the address bits are matched with predetermined row address bits selected from the plurality of row address bits, the at least one programming circuit producing a matching signal when the address bits are matched with the predetermined row address bits; and f) at least one redundant row address decoder circuit associated with redundant word lines selected from the plurality of redundant word lines, and supplied with the matching signal and with at least one row address bit selected from the plurality of row address bits except for the predetermined row address bits, the at least one redundant row address decoder circuit selectively driving the associated redundant word lines in the presence of the matching signal.

BRIEF DESCRIPTION OF THE DRAWINGS

The feature and advantages of the random access memory device according to the present invention will be more clearly understood from the following description taken in conjunction with the accompanying drawings in which.

DESCRIPTION OF THE PREFERRED EMBODIMENTS

First Embodiment

Figure 4:
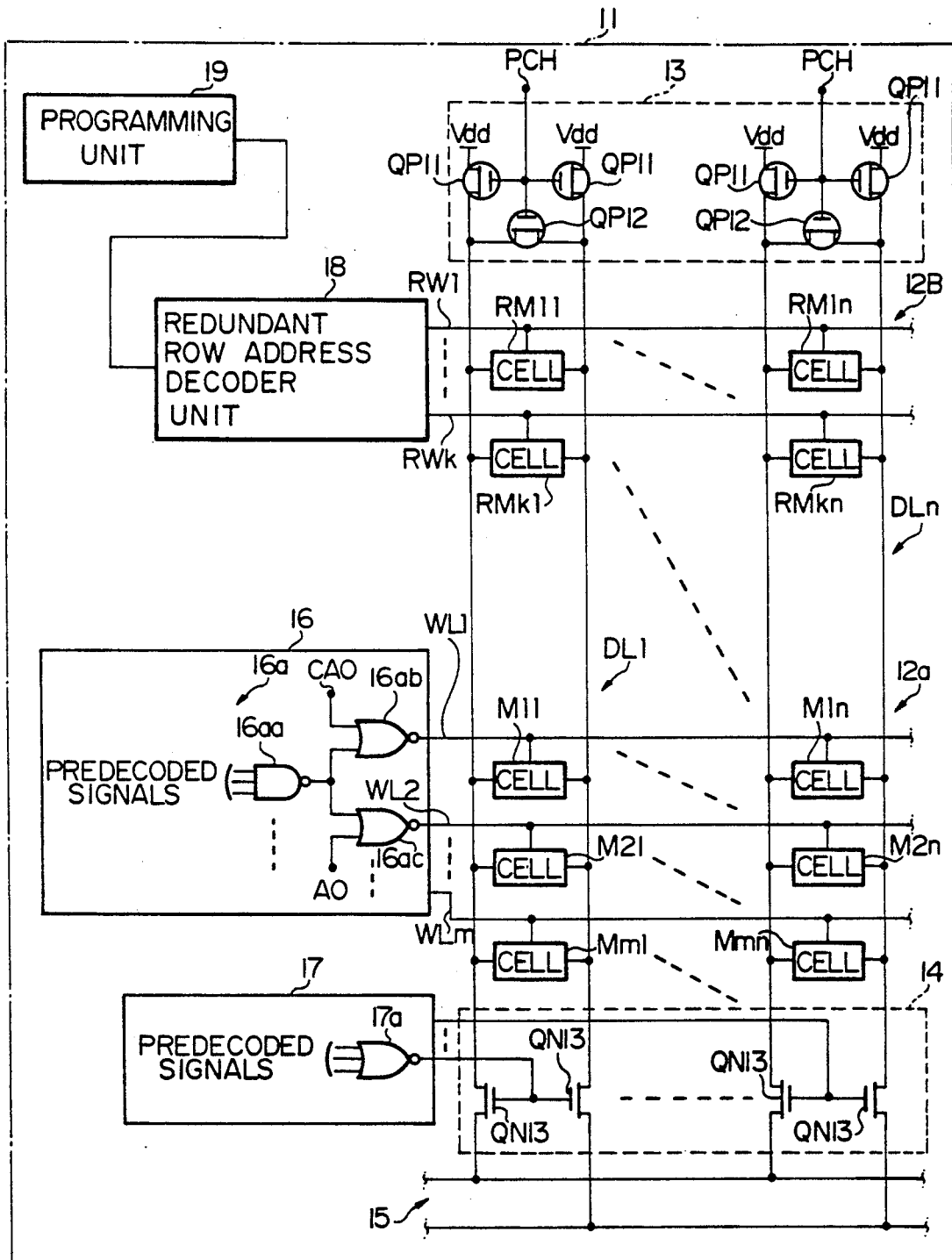
FIG. 4 is a circuit diagram showing the arrangement of a random access memory device according to the present invention.

Referring to FIG. 4 of the drawings, a random access memory device embodying the present invention is fabricated on a single semiconductor chip 11, and the random access memory device comprises a regular memory cell array 12a implemented by a large number of regular memory cells M11, M1n, M21 and M2n, Mm1... and Mmn, and arranged in rows and columns. The random access memory device further comprises a redundant memory cell array 12b constituted by a plurality of redundant memory cells RM11, RM1n, RMk1 and RMkn, and are also arranged in rows and columns. The regular memory cells M11 to Mmn and the redundant memory cells RM11 to RMkn are similar in circuit arrangement, and each row of the regular memory cells M11 to Mmn is replaceable with one of the rows of the redundant memory cells RM11 to RM1n or RMk1 to RMkn.

The rows of the regular memory cell array 12a are respectively associated with a plurality of regular word lines WL1 WL2 to WLm, and the rows of the redundant memory cell array 12b are respectively associated with redundant word lines RW1 to RWk. A plurality of digit line pairs DL1 to DLn are shared between the regular memory cell array 12a and the redundant memory cell array 12b, and each of the digit line pairs DL1 to DLn is coupled with one of the columns of the regular memory cell array 12a as well as with one of the columns of the redundant memory cell array 12b.

A precharging unit 13 is provided for the digit line pairs DL1 to DLn, and the precharging unit 13 comprises p-channel enhancement type charging transistors QP11 coupled between a power voltage line Vdd ad the bit line pairs DL1 to DLn and p-channel enhancement type balancing transistors QP12 coupled between the drain nodes of the associated p-channel enhancement type charging transistors QP11. The p-channel enhancement type charging transistors QP11 and the p-channel enhancement type balancing transistors QP12 are responsive to a precharging signal PCH of active low voltage level. When the precharging signal PCH allows the p-channel enhancement type charging transistors QP11 and the p-channel enhancement type balancing transistors QP12 to simultaneously turn on, the power voltage line Vdd is coupled with the bit line pairs DL1 to DLn through the p-channel enhancement type charging transistors QP11, and the digit lines of every digit line pair is equalized through the associated p-channel enhancement type balancing transistor QP12.

The digit line pairs DL1 to DLn are further coupled with a column selector 14, and the column selector 14 is implemented by pairs of n-channel enhancement type transfer transistors QN13. Each pair of n-channel enhancement type transfer transistors QN13 is associated with one of the digit line pairs DL1 to DLn, and all pairs of n-channel enhancement type transfer transistors QN13 are coupled between the digit line pairs DL1 to DLn and a data bus 15. Though not shown in FIG. 4, the data bus 15 is further coupled with a data buffer unit, and the data buffer unit is communicable with an external device.

A row address decoder unit 16 is associated with the regular word lines WL1 to WLm, and the row address decoder unit 16 has a plurality of row address decoder circuits each provided in association with every two regular word lines. FIG. 4 shows only one of the plurality of row address decoder circuits which is designated by reference 16a. The row address decoder circuit 16a is implemented by a NAND gate 16aa and two NOR gates 16ab and 16ac, and the NOR gates 16ab an 16 ac respectively drive the associated regular word line WL1 and WL2. Though not shown in FIG. 4, an external row address signal is supplied to a predecoder unit, and the predecoded row address signals are selectively distributed to the plurality of row address decoder circuits. The row address bit A0 and the complementary bit thereof CA0 are respectively supplied from an address buffer unit (not shown) to the NOR gates 16ab and 16ac, and the predecoded row address signals are selectively supplied to the NAND gates 16aa. Therefore, the row address decoder unit 16 drives one of the regular word lines WL1 to WLm, and the regular word line driven by the row address decoder unit 16 allows the associated row of the regular memory cells to be coupled with the digit line pairs DL1 to DLn.

A column address decoder unit 17 is provided for the column selector unit 14, and is implemented by a plurality of NOR gates. One of the NOR gates is shown in FIG. 4, and is labeled with 17a. Each of the NOR gates forming a part of the column address decoder unit 17 is coupled with one of the pairs of n-channel enhancement type transfer transistors QN13, and the column address decoder unit 17 allows the pairs of n-channel enhancement type transfer transistors QN13 to selectively turn on. Namely, when an external column address signal is supplied to a predecoder unit (not shown), the predecoder unit produces predecoded column address signals, and selectively distributes the predecoded column address signals to the NOR gates. The predecoded column address signals allow one of the NOR gates of the column selector unit 14 to produce a gate control signal of an active high voltage level, and the associated pair of n-channel enhancement type transfer transistors QN13 to turn on.

If all of the regular memory cells M11 to Mmn are excellent, any row of the regular memory cell array 12a is not replaced with the row of the redundant memory cells RM11 to RM1n or RMk1 to RMkn. Therefore, only the regular memory cell array 12a serves as a data storage, and data bits are written into or read out from the regular memory cell array 12a. This means that the redundant memory cell array 12b is redundant.

If the external row address signal and the external column address signal are indicative of the address assigned to the regular memory cell M11, the row address decoder unit 16 drives the regular word line WL1 to the active high voltage level, and the column address decoder unit 17 allows the pair of n-channel enhancement type transfer transistors QN13 associated with the bit line pair DL1 to turn on. In this situation, the data bus 15 is coupled with the regular memory cell M11, and a data bit is read out from or written into the regular memory cell M11 through the data bus 15.

However, if a defective regular memory cell is found in a diagnosis operation, the row containing the defective regular memory cell is replaced with one of the rows of the redundant memory cell array 12b, and the row of the redundant memory cells forms a part of the data storage instead of the defective row.

In detail, a redundant row address decoder unit 18 is provided for the redundant word lines RW1 to RWk, and the redundant row address decoder unit 18 is implemented by a plurality of redundant row address decoder circuits respectively coupled with the redundant word lines RW1 to RWk. The redundant row address decoder circuits are associated with a programming unit 19, and the programming unit 19 is implemented by a plurality of programming circuits. However, each of the programming circuits is associated with two redundant row address decoder circuits in this instance. Each of the programming circuits stores the row address bits common to defective rows respectively replaced with the associated two rows of the redundant memory cells. Each of the programming circuits monitors the row address bits to see whether or not an external row address signal is indicative of one of the defective rows. If a regular memory cell in one of the defective rows is accessed, one of the programming circuits discriminates the common row address bits, and causes the associated redundant row address decoder circuit to decide which redundant word line should be lifted to the active high voltage level on the basis of a row address bit directly supplied thereto. The row address decoder unit 16 allows the regular word line coupled with the defective memory cell to remain inactive. For this reason, the redundant memory cells are respectively coupled with the digit line pairs DL1 to DLn instead of the defective row.

Figure 5:
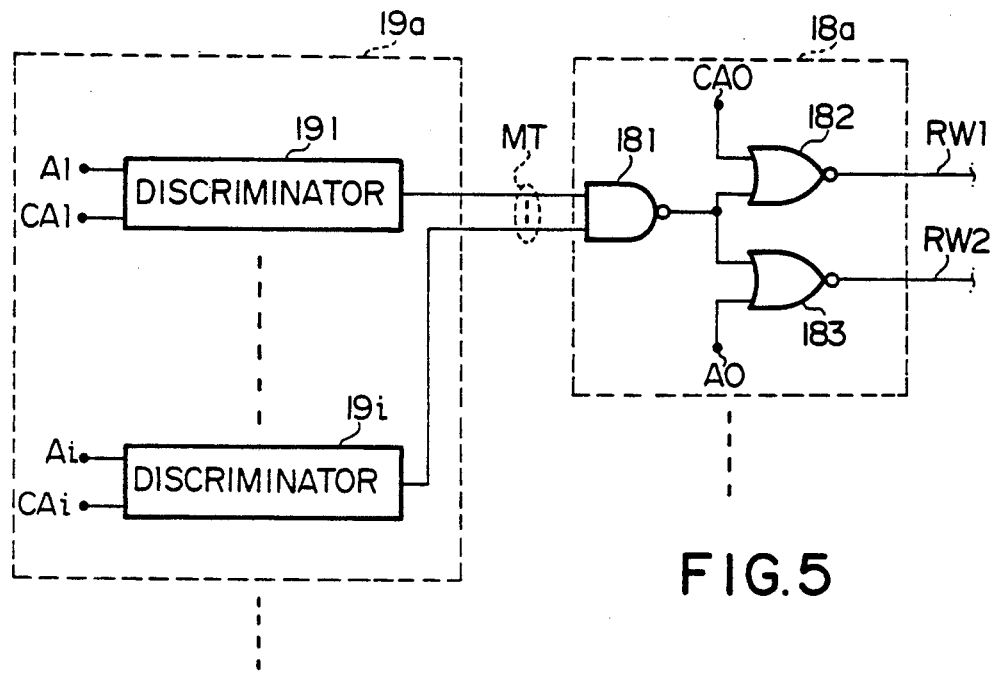
FIG. 5 is a circuit diagram showing the arrangement of a redundant row address decoder circuit associated with a programming circuit both incorporated in the random access memory device shown in FIG. 4.

FIG. 5 shows the circuit arrangement of one of the redundant row address decoder circuits 18a associated with the programming circuit 19a. The redundant row address decoder circuit 18a is assumed to be coupled with the redundant word lines RW1 and RW2. The programming circuit 19a is constituted by a plurality of discriminators 191 to 19i which is smaller in number than those of the prior art discriminators incorporated in each programming circuit by one. However, each of the discriminators 191 to 19i is similar in circuit arrangement to the discriminators 910 to 91i, and no further description is made on the arrangement of each discriminator 191 or 19i. The row address bits A1 to Ai respectively paired with the complementary bits thereof are supplied from the address buffer unit (not shown) to the discriminators 191 to 19i, respectively, and are further supplied to the other programming circuits of the programming unit 19. The discriminators 191 to 19i store the address bits A1' to Ai' common to the two defective rows replaced with the rows of the redundant memory cells replaced with the redundant word lines RW1 and RW2, respectively. If the row address bits A1 to Ai are matched with the address bits A1' to Ai', respectively, all of the discriminators 191 to 19i supply logic "1" bits forming in combination a matching signal MT.

The redundant row address decoder circuit 18a comprises a NAND gate 181 supplied with the matching signal MT, and two NOR gates 182 and 183 both coupled with the output node of the NAND gate 181. The row address bit A0 and the complementary bit CA0 are supplied from the buffer unit (not shown) to the NOR gates 182 and 183, respectively. If the matching signal MT consists of logic "1" bits only, the NAND gate 181 produces the output signal of logic "0" level, and the output signal of logic "0" level enables the NOR gates 182 and 183. If the row address bit A0 is logic "1", the complementary bit CA0 allows the NOR gate 182 to drive the associated redundant word line RW1 to an active high voltage level. If, on the other hand, the row address bit A0 is logic "0" level, the row address bit A0 allows the NOR gate 183 to drive the associated redundant word line RW2 instead of the redundant word line RW1.

As will be understood from the forgoing description, the random access memory device embodying the present invention decreases the discriminators by virtue of the NOR gates 182 and 183 supplied with the row address bit A0 and the complementary bit thereof. If the random access memory device shown in FIG. 4 is of the 1 mega-bit type having 512 word lines, only 8 discriminators 191 to 19$i$ can monitor the row addresses respectively assigned to two defective rows. As described hereinbefore, the prior art random access memory device requires 18 discriminators 910 to 91$i$ for the two defective rows which are more than twice of those incorporated in the random access memory device embodying the present invention.

Second Embodiment

Figure 6:
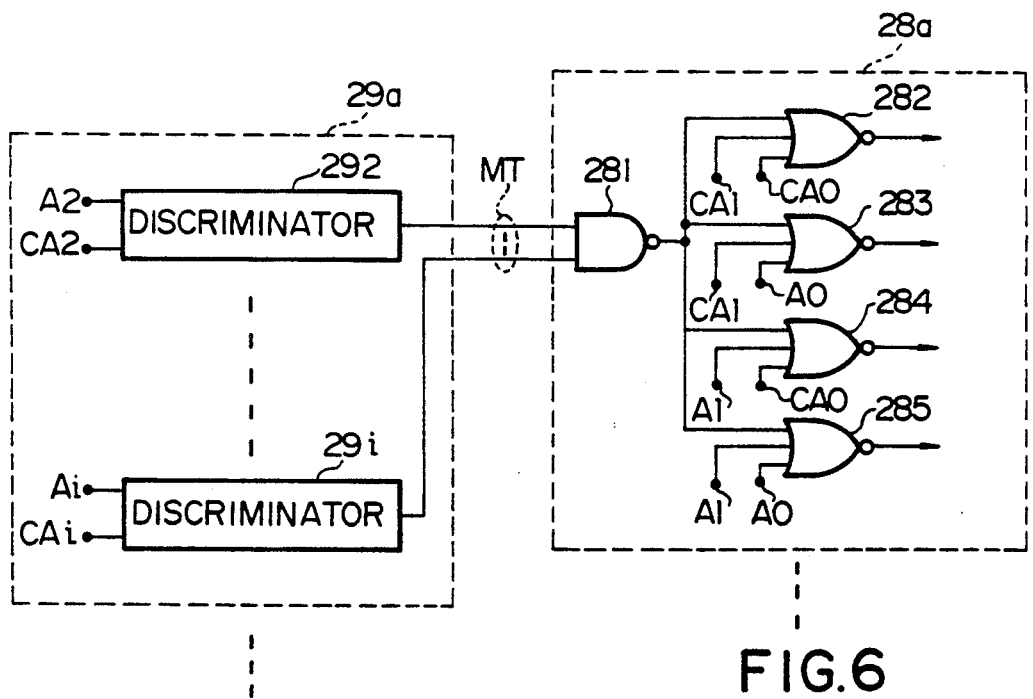
FIG. 6 is a circuit diagram showing the arrangement of a redundant row address decoder circuit associated with a programming circuit incorporated in another random access memory device according to the present invention.

Turning to FIG. 6, a redundant row address decoder circuit 28$a$ is associated with a programming circuit 29$a$. The redundant row address decoder circuit 28$a$ forms a part of a redundant row address decoder unit, and the programming circuit 29$a$ is incorporated in a programming unit. Both of the redundant row address decoder unit and the programming unit form parts of another random access memory device embodying the present invention. However, the other circuit components are similar to those of the first embodiment, and no further description is incorporated hereinbelow for the sake of simplicity.

Figure 1:
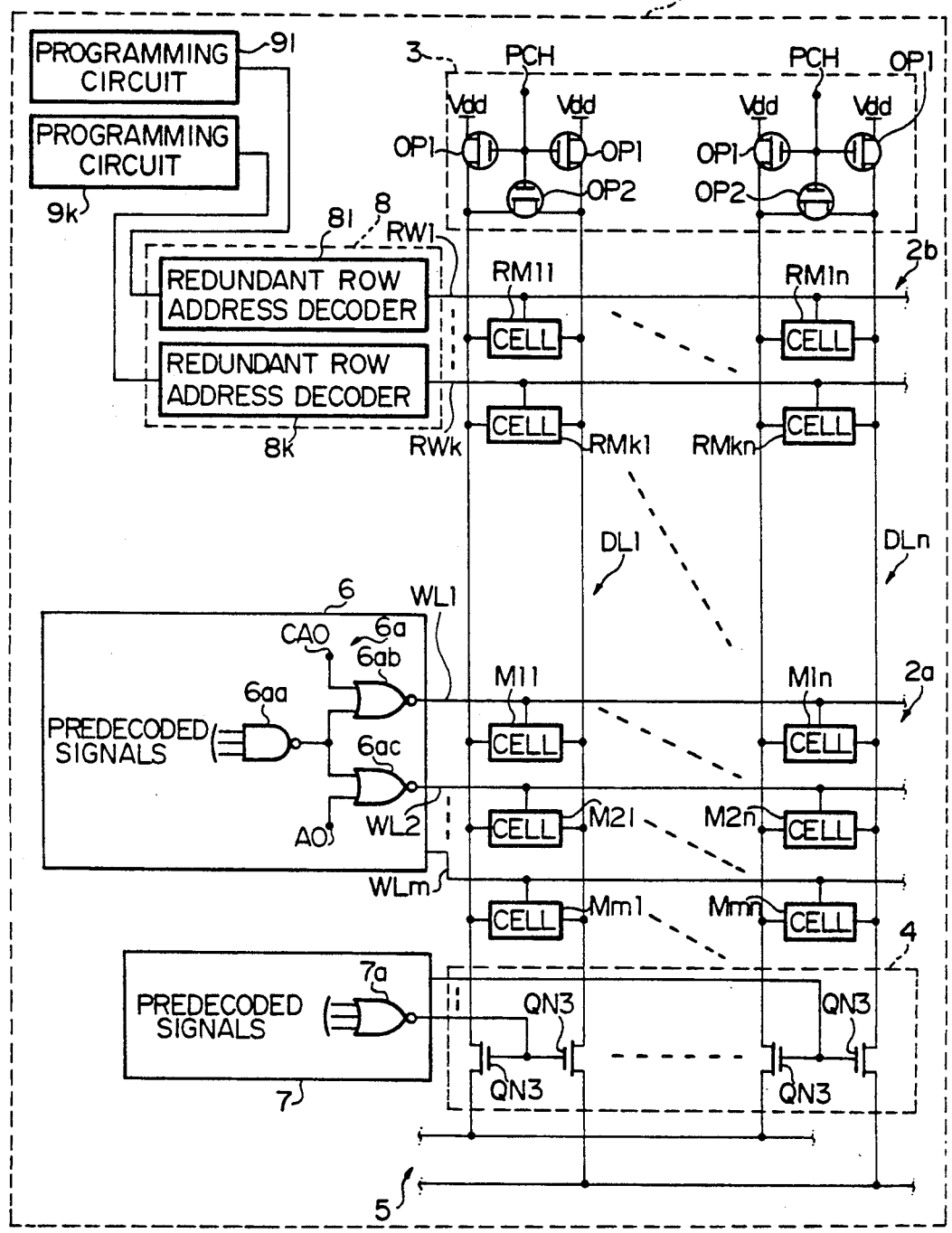
FIG. 1 is a circuit diagram showing the arrangement of the prior art random access memory device.
Figure 2:
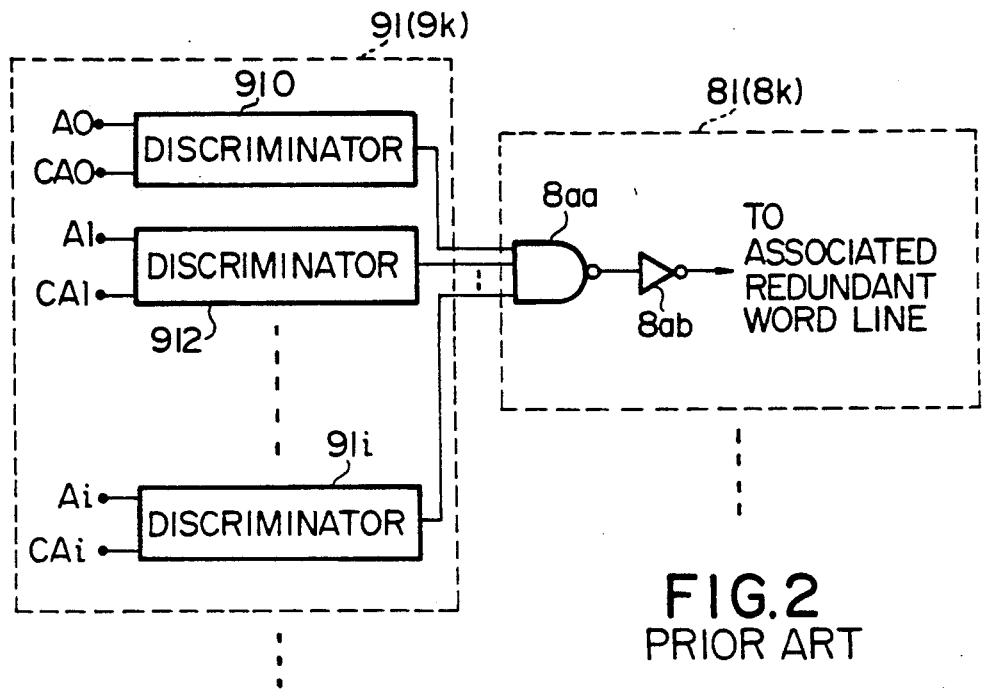
FIG. 2 is a circuit diagram showing the arrangement of a redundant row address decoder circuit associated with a programming circuit both incorporated in the prior art random access memory device.
Figure 3:
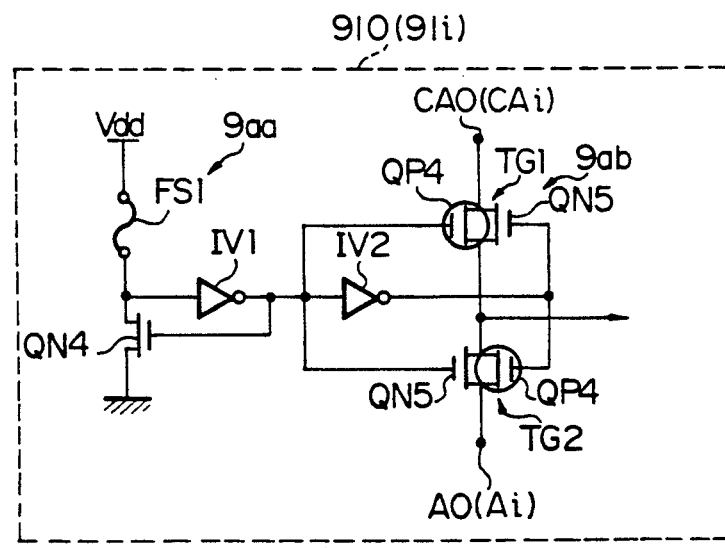
FIG. 3 is a circuit diagram showing the arrangement of a discriminator incorporated in the programming circuit.

The programming circuit 29$a$ is implemented by a plurality of discriminators 292 to 29$i$ each similar in circuit arrangement to that shown in FIG. 3. However, the programming circuit 29$a$ can discriminate row address bits common to four defective rows respectively replaced with the four rows of the redundant memory cells. Therefore, the row address bits A2 to Ai respectively paired with the complementary bits thereof are supplied from an address buffer unit (not shown) to the discriminators 292 to 29$i$, respectively. If the row address bits A2 to Ai are common to the four defective rows, the programming circuit 29$a$ produces a matching signal consisting of logic "1" bits.

The redundant row address circuit 28$a$ comprises a NAND gate 281 and four NOR gates 282 to 285, and row address bits A0 and A1 and the complementary bits thereof CA0 and CA1 are selectively distributed to the NOR gates 282 to 285. When the matching signal MT is produced, the NAND gate 281 yields the output signal of logic "0" level, and the NOR gates 282 to 285 are simultaneously enabled with the output signal of logic "0" level. If both row address bits A0 and A1 are logic "1" level, the complementary bits CA0 and CA1 allows the NOR gate 282 to drive the associated redundant word line to an active high voltage level. If one of the row address bits A0 and A1 is logic "1", level, either NOR gate 283 or 284 drives the associated redundant word line to the active high voltage level. With the row address bits A0 and A1 of logic "0" level, the NOR gate 285 lifts the associated redundant word line to the active high voltage level.

In this instance, the 1 mega-bit random access memory device is equipped with the programming circuits each consisting of only seven discriminators 292 to 29$i$, and the real estate for the programming circuit is further decreased.

Although particular embodiments of the present invention have been shown and described, it will be obvious to those skilled in the art that various changes and modifications may be made without departing from the spirit and scope of the present invention. For example, the redundant row address decoder circuit may be available as a redundant column address decoder circuit associated with a column selector.

What is claimed is:

1. A random access memory device fabricated on a single semiconductor chip, comprising:
   a) a plurality of regular memory cells arranged in rows and columns, and respectively storing data bits, each of said regular memory cells having a row address indicated by a plurality of row address bits and a column address indicated by a plurality of column address bits;
   b) a plurality of regular word lines respectively associated with said rows of said regular memory cells, and selectively driven for making one of said rows of said regular memory cells accessible;
   c) a plurality of redundant memory cells arranged in rows and columns, each of said rows of said regular memory cells being replaceable with one of said rows of said redundant memory cells for storing data bits;
   d) a plurality of redundant word lines respectively associated with said rows of said redundant memory cells, and selectively driven for making one of said rows of said redundant memory cells accessible;
   e) at lease one programming circuit storing address bits representative of a row address assigned to one of said rows including at least one defective regular memory cell, and operative to determine whether said address bits are matched with predetermined row address bits selected from said plurality of row address bits, said at least one programming circuit producing a matching signal when said address bits are matched with said predetermined row address bits; and
   f) at lease one redundant row address decoder circuit associated with four redundant word lines selected from said plurality of redundant word lines for allowing said four redundant word lines to be selectively accessible, and supplied with said matching signal and with two row address bits and corresponding complementary bits of said two row address bits indicative of one of said four redundant word lines, said at least one redundant row address decoder circuit selectively driving one of said four redundant word lines in the presence of said matching signal.

2. A random access memory device as set forth in claim 1, in which said at least one redundant row address decoder circuit comprises a NAND gate supplied with said matching signal for producing an enable signal, and a plurality of NOR gates enabled with said enable signal and respectively coupled with said first redundant word lines, said at least one address bit and the complementary bit thereof are selectively supplied to said plurality of NOR gates, respectively, wherein one of said first redundant word lines is driven depending upon an output of each of said NOR gates.

3. A random access memory device as set forth in claim 2, in which said at least one redundant row address decoder circuit forms a part of a redundant row address decoder unit selectively driving said plurality of redundant word lines.

4. A random access memory device as set forth in claim 3, in which said plurality of NOR gates includes a first NOR gate supplied with said complementary bit of said at least one row address bit, and a second NOR gate supplied with said at least one row address bit.

5. A random access memory device as set forth in claim 4, in which said random access memory device further comprises g) a row address decoder unit having a plurality of row address decoder circuits each associated with every two word lines selected from said plurality of word lines, each of said row address decoder circuits having a NAND gate supplied with predecoded row address signals and producing another enable signal, and two NOR gates simultaneously enabled with said another enable signal and selectively driving said associated two word lines depending upon the logic level of one of said plurality of row address bits.

6. A random access memory device fabricated on a single semiconductor chip, comprising:
   a) a plurality of regular memory cells arranged in rows and columns, and respectively storing data bits, each of said regular memory cells having a row address indicated by a plurality of row address bits and a column address indicated by a plurality of column address bits;
   b) a plurality of regular word lines respectively associated with said rows of said regular memory cells, and selectively driven for making one of said rows of said regular memory cells accessible;
   c) a plurality of redundant memory cells arranged in rows and columns, each of said rows of said regular memory cells being replaceable with one of said rows of said redundant memory cells for storing data bits;
   d) a plurality of redundant word lines respectively associated with said rows of said redundant memory cells, and selectively driven for making one of said rows of said redundant memory cells accessible;
   e) at least one programming circuit storing address bits representative of a row address assigned to one of said rows including at least one defective regular memory cell, and operative to determine whether said address bits are matched with predetermined row address bits selected from said plurality of row address bits, said at least one programming circuit producing a matching signal when said address bits are matched with said predetermined row address bits; and
   f) at least one redundant row address decoder circuit associated with first redundant word lines selected from said plurality of redundant word lines for allowing said first redundant word lines to be selectively accessible, and supplied with said matching signal and with at least one row address bits and a corresponding complementary bit indicative of one of said first redundant word lines, said at least one redundant row address decoder circuit selectively driving one of said first redundant word lines in the presence of said matching signal, wherein
   said at least one redundant row address decoder circuit comprises a NAND gate supplied with said matching signal for producing an enable signal, and a plurality of NOR gates enabled with said enable signal and respectively coupled with said first redundant word lines, said at least one address bit and the complementary bit thereof are selectively supplied to said plurality of NOR gates, respectively, wherein one of said first redundant word lines is driven depending upon an output of each of said NOR gates, and wherein
   said at least one redundant row address decoder circuit forms a part of a redundant row address decoder unit selectively driving said plurality of redundant word lines,
   said plurality of NOR gates includes a first NOR gate supplied with said at least one row address bit and with another row address bit, a second NOR gate supplied with said at least one row address bit and with another complementary row address bit, a third NOR gate supplied with said complementary bit of said at least one row address bit and with said another complementary bit of said another row address bit selected from said plurality of row address bits, a fourth NOR gate supplied with said complementary bit of said at least one row address bit and with said another row address bit, said another row address bit and said another complementary row address bit corresponding to a row address of another one of said rows of said redundant memory cells, said at least one programming circuit being supplied with said plurality of row address bits except for said at least one row address bit and said another row address bit.

7. A random access memory device fabricated on a single semiconductor chip, comprising:
   a) a plurality of regular memory cells arranged in a plurality of memory lines, each of said memory lines being assigned an address represented by a plurality of address bits, two of said plurality of regular memory lines being grouped to form a plurality of memory line pairs;
   b) a plurality of redundant memory cells arranged in a plurality of redundant lines, two of said redundant lines being grouped to form a plurality of redundant line pairs, each of said memory line pairs being replaceable with one of said plurality of redundant line pairs;
   c) at lease one programming circuit storing address bits representative of a line address assigned to one of said memory lines including at least one defective regular memory cell, and operative to determine whether said address bits are matched with predetermined address bits selected from said plurality of address bits, said at least one programming circuit producing a matching signal when said address bits are matched with said predetermined address bits; and
   d) at lease one address decoder circuit associated with one of said redundant line pairs, and responsive to said matching signal and at least one address bit and a corresponding complementary bit of said plurality of address bits except for said predetermined address bits for designating one of the redundant lines of the associated redundant line pair.

8. A memory device comprising:
   a first memory cell array having a plurality of memory cells arranged in rows and columns;
   a second memory cell array having a plurality of memory cells arranged in rows and columns;
   a programming circuit for programming predetermined bits selected from address bits representing a row address assigned to a predetermined row in said first memory cell array; and
   a decoder circuit responsive to a signal from said programming circuit, and allowing a plurality of rows in said second memory cell array to be selected instead of a plurality of rows in said first memory cell array including said predetermined row.

* * * * *